(12) United States Patent
Noda et al.

(10) Patent No.: US 9,123,692 B2
(45) Date of Patent: Sep. 1, 2015

(54) SEMICONDUCTOR DEVICE AND METHOD OF MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Kosei Noda, Kanagawa (JP); Yuta Endo, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 173 days.

(21) Appl. No.: 13/668,454

(22) Filed: Nov. 5, 2012

(65) Prior Publication Data

US 2013/0119377 A1    May 16, 2013

(30) Foreign Application Priority Data

Nov. 10, 2011 (JP) ................. 2011-246328

(51) Int. Cl.
*H01L 29/10* (2006.01)
*H01L 29/417* (2006.01)
(Continued)

(52) U.S. Cl.
CPC .......... *H01L 29/41733* (2013.01); *H01L 29/45* (2013.01); *H01L 29/66969* (2013.01); *H01L 29/7869* (2013.01); *H01L 29/78603* (2013.01);
(Continued)

(58) Field of Classification Search
CPC ..................... H01L 29/7869; H01L 29/66969; H01L 27/1225; H01L 21/02565
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Whitney T Moore
*Assistant Examiner* — Joseph Galvin, III
(74) *Attorney, Agent, or Firm* — Nixon Peabody LLP; Jeffrey L. Costellia

(57) ABSTRACT

By reducing the contact resistance between an oxide semiconductor film and a metal film, a transistor that uses an oxide semiconductor film and has excellent on-state characteristics is provided. A semiconductor device includes a pair of electrodes over an insulating surface; an oxide semiconductor film in contact with the pair of electrodes; a gate insulating film over the oxide semiconductor film; and a gate electrode overlapping with the oxide semiconductor film with the gate insulating film interposed therebetween. In the semiconductor device, the pair of electrodes contains a halogen element in a region in contact with the oxide semiconductor film. Further, plasma treatment in an atmosphere containing fluorine can be performed so that the pair of electrodes contains the halogen element in a region in contact with the oxide semiconductor film.

20 Claims, 10 Drawing Sheets

(51) Int. Cl.
*H01L 29/45* (2006.01)
*H01L 29/786* (2006.01)
*H01L 29/66* (2006.01)

(52) U.S. Cl.
CPC .... *H01L 29/78618* (2013.01); *H01L 29/78636* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,129,717 B2 | 3/2012 | Yamazaki et al. |
| 8,642,412 B2 | 2/2014 | Yamazaki et al. |
| 8,729,544 B2 | 5/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0029399 A1 | 2/2004 | Honma et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1* | 5/2007 | Akimoto ............... 257/61 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025677 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301329 A1 | 12/2010 | Asano et al. |
| 2011/0215331 A1* | 9/2011 | Yamazaki et al. ............... 257/60 |
| 2012/0003795 A1 | 1/2012 | Noda |
| 2012/0064703 A1 | 3/2012 | Jintyou et al. |
| 2012/0298998 A1* | 11/2012 | Yamazaki et al. ............... 257/57 |
| 2013/0099230 A1 | 4/2013 | Yamazaki et al. |
| 2014/0138683 A1 | 5/2014 | Yamazaki et al. |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 06-275697 | 9/1994 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2011-009724 | 1/2011 |
| JP | 2011-049542 | 3/2011 |
| WO | WO-2004-114391 A1 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Dputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Sympoisum Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : Sid International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Sympoisum Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Sympoisum Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a manufacturing method thereof.

Note that in this specification, a semiconductor device refers to any device that can function by utilizing semiconductor characteristics, and an electro-optical device, a semiconductor circuit, and an electronic device are all semiconductor devices.

2. Description of the Related Art

As materials of semiconductor thin films applicable to the transistors, silicon-based semiconductor materials have been widely used, but oxide semiconductors have been attracting attention as alternative materials.

In many cases, transistors that use amorphous silicon, which can be manufactured using the established manufacturing technique, are utilized in display devices; however, the transistors that use amorphous silicon have low field-effect mobility, having difficulty in achieving high definition, low power consumption, and the like of display devices.

Further, the transistors that use amorphous silicon also have a problem of severe electrical characteristic deterioration (low reliability), which occurs with the temperature variation or repetitive operation.

As the integration becomes higher obeying the scaling law and the circuit structure becomes complex, a problem of an increase in power consumption becomes more significant in semiconductor devices (such as semiconductor memory devices) utilizing transistors that use single crystal silicon and have high field-effect mobility.

It is known that a transistor that uses an oxide semiconductor has higher field-effect mobility than a transistor that uses amorphous silicon. In addition, the oxide semiconductor can be easily deposited on a mother glass which has a large area by a sputtering method or the like, and thus, application of the oxide semiconductor to display devices has been actively examined.

On the other hand, it is pointed out that aluminum oxide having high resistance is produced when the oxide semiconductor is directly connected to an aluminum-based alloy wiring, thereby increasing contact resistance (see Patent Document 1).

Even in the case of using a metal that is relatively unlikely to be oxidized or a metal, an oxide of which has a conducting property, a metal oxide having high resistance is often produced at the interface between the metal and an oxide semiconductor by heat treatment or the like in a later step; accordingly, contact resistance is often increased.

There is a problem in that such high contact resistance between a metal and an oxide semiconductor causes a reduction in on-state characteristics of a transistor.

As a method for reducing the contact resistance, a technique in which a buffer layer having low resistance is provided between an oxide semiconductor and a metal is disclosed. In addition, an oxide semiconductor containing nitrogen, which serves as a buffer layer, is disclosed (see Patent Document 2).

REFERENCE

[Patent Document 1] Japanese Published Patent Application No. 2011-49542

[Patent Document 2] Japanese Published Patent Application No. 2011-9724

SUMMARY OF THE INVENTION

As described above, in the transistor that uses the oxide semiconductor film, the contact resistance between the metal film and the oxide semiconductor film degrades on-state characteristics of the transistor; thus, sufficient performance of a semiconductor device including the transistor might not be obtained.

Specifically, some factors that inhibit carrier transfer may degrade the on-state current of the transistor to about 30% to 70%, or 10% or less under certain circumstances, of the inherent on-state current of the transistor.

Thus, it is desired that in the transistor that uses the oxide semiconductor film, the contact resistance between the oxide semiconductor film and the metal film, which is a cause for lowering of on-state characteristics, be reduced.

An object of one embodiment of the present invention is to reduce contact resistance between an oxide semiconductor film and a metal film.

Further, another object of one embodiment of the present invention is to provide a transistor that uses an oxide semiconductor film and has excellent on-state characteristics.

One embodiment of the present invention is a semiconductor device including a pair of electrodes over an insulating surface, an oxide semiconductor film in contact with the pair of electrodes, a gate insulating film over the oxide semiconductor film, and a gate electrode overlapping with the oxide semiconductor film with the gate insulating film interposed therebetween. In the semiconductor device, the pair of electrodes contains a halogen element in a region in contact with the oxide semiconductor film.

One embodiment of the present invention is a semiconductor device including a gate electrode over an insulating surface, a gate insulating film over the gate electrode, a pair of electrodes over the gate insulating film, and an oxide semiconductor film in contact with the pair of electrodes. In the semiconductor device, the pair of electrodes contains a halogen element in a region in contact with the oxide semiconductor film.

According to one embodiment of the present invention, a method of manufacturing a semiconductor device includes: forming a pair of electrodes over an insulating surface, forming an oxide semiconductor film in contact with the pair of electrodes after halogenation treatment is performed on the pair of electrodes, forming a gate insulating film over the oxide semiconductor film, and forming a gate electrode overlapping with the oxide semiconductor film with the gate insulating film interposed therebetween.

According to one embodiment of the present invention, a method of manufacturing a semiconductor device includes: forming a gate electrode over an insulating surface, forming a gate insulating film over the gate electrode, forming a pair of electrodes over the gate insulating film, and forming an oxide semiconductor film in contact with the pair of electrodes after halogenation treatment is performed on the pair of electrodes.

In the method of manufacturing a semiconductor device in one embodiment of the present invention, the halogenation treatment is plasma treatment in an atmosphere containing fluorine. As the atmosphere containing fluorine, a nitrogen trifluoride gas or the like can be used, for example. For the plasma treatment, an inductively coupled plasma (ICP) apparatus or the like can be used. Further, with the use of a high-density plasma apparatus, damage by plasma to an object is suppressed, which is preferable.

The halogenation treatment is not limited to the plasma treatment. The halogenation treatment can also be performed by exposing an object to an atmosphere containing a halogen element. At this time, heating the object promotes the halogenation treatment, which is preferable. Alternatively, the treatment also may be performed by soaking the object in a liquid containing a halogen element.

The semiconductor device of one embodiment of the present invention has so-called a bottom-contact transistor structure where the oxide semiconductor film is in contact with the top surface of the pair of electrodes which functions as a source electrode and a drain electrode. By using such a structure, there is no adverse effect such that the oxide semiconductor film is etched when the pair of electrodes is processed by dry etching or the like; thus, the thickness of the oxide semiconductor film can be easily controlled. In addition, there is no damage due to processing; thus, the reliability of the transistor is improved. The above effects can be obtained both in a top-gate transistor structure and in a bottom-gate transistor structure.

When the oxide semiconductor film is formed over the metal film or heat treatment is conducted in a state that the oxide semiconductor film is in contact with the metal film, the metal film is oxidized by oxygen from the oxide semiconductor film. Accordingly, a metal oxide film is produced at the interface between the metal film and the oxide semiconductor film. This results in an increase in the contact resistance between the metal film and the oxide semiconductor film.

In view of the above, before the formation of the oxide semiconductor film, a bond between metal contained in the metal film and halogen (termination by halogen) is formed at least in the surface of the metal film in contact with the oxide semiconductor film, so that the reaction between the metal film and the oxide semiconductor film and the formation of the metal oxide film can be suppressed. Accordingly, the increase in the contact resistance between the metal film and the oxide semiconductor film can be suppressed. At the same time, diffusion of oxygen from the oxide semiconductor film into the metal film can be prevented. Thus, formation of an oxygen vacancy in the oxide semiconductor film can be suppressed.

According to one embodiment of the present invention, the contact resistance between an oxide semiconductor film and a metal film can be reduced.

According to one embodiment of the present invention, a transistor that uses an oxide semiconductor film and has excellent on-state characteristics can be provided.

DETAILED DESCRIPTION OF THE INVENTION (Embodiment 1)

In this embodiment, transistors each of which is a semiconductor device of one embodiment of the present invention and a method of manufacturing the transistor will be described with reference to FIGS. 1A and 1B, FIG. 2, FIGS. 3A to 3C, and FIGS. 4A to 4C.

Figure 1A:
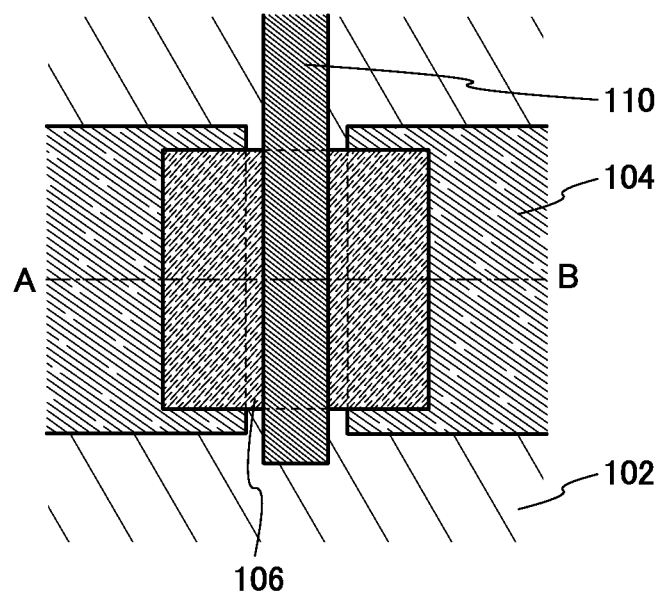
FIGS. 1A and 1B are a top view and a cross-sectional view illustrating an example of a transistor in one embodiment of the present invention.
Figure 1B:
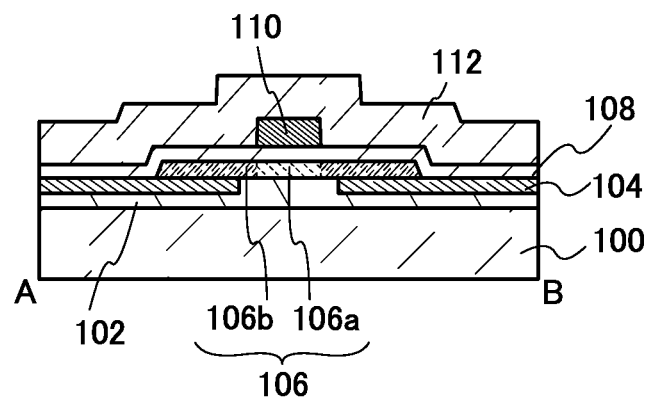

FIG. 1A is a top view and FIG. 1B is a cross-sectional view of a transistor which is a semiconductor device of one embodiment of the present invention. FIG. 1B illustrates a cross section A-B taken along a dashed-dotted line A-B in the top view of the transistor in FIG. 1A. Note that an interlayer insulating film 112, a gate insulating film 108, and the like are not illustrated in FIG. 1A for simplicity.

The transistor illustrated in FIG. 1B includes a base insulating film 102 over a substrate 100, a pair of electrodes 104 over the base insulating film 102, an oxide semiconductor film 106 in contact with the pair of electrodes 104, a gate insulating film 108 over the oxide semiconductor film 106, a gate electrode 110 overlapping with the oxide semiconductor film 106 with the gate insulating film 108 interposed therebetween, and an interlayer insulating film 112 over the gate electrode 110 and the gate insulating film 108. Note that the base insulating film 102 may be omitted.

The pair of electrodes 104 may be formed to have a single-layer structure or a stacked-layer structure using one or more of Si, Ge, Al, Ti, Cr, Co, Ni, Cu, Y, Zr, Mo, Ag, Ru, Ta, Sn, and W, a nitride of any of these elements, an oxide of any of these elements, and an alloy of any of these elements. Alternatively, an oxide or an oxynitride which contains at least In and Zn may be used. For example, an In—Ga—Zn—O—N-based material can be used. Note that the pair of electrodes 104 functions as source and drain electrodes of the transistor and can also be used as a wiring.

The pair of electrodes 104 contains a halogen element in a region in contact with the oxide semiconductor film 106. For example, fluorine or chlorine is contained. In this manner, a bond between metal in the pair of electrodes 104 and halogen (termination by halogen) is formed at least in the surface of the pair of electrodes 104 in contact with the oxide semiconductor film 106, so that the reaction between the pair of electrodes 104 and the oxide semiconductor film 106 and the formation of a metal oxide film can be suppressed. Therefore, occurrence of a resistance component caused by the formation of the metal oxide film can be suppressed and the contact resistance between the pair of electrodes 104 and the oxide semiconductor film 106 can be reduced. At the same time, diffusion of oxygen from the oxide semiconductor film 106 into the pair of electrodes 104 can be prevented. Thus, formation of an oxygen vacancy in the oxide semiconductor film 106 can be suppressed.

The oxide semiconductor film 106 includes a pair of low-resistance regions 106b and a high-resistance region 106a.

The pair of low-resistance regions 106b contains an impurity that reduces the resistance of the oxide semiconductor film. For example, the pair of low-resistance regions 106b contains one or more elements selected from hydrogen, helium, boron, nitrogen, fluorine, neon, aluminum, phosphorus, argon, arsenic, krypton, indium, tin, antimony, and xenon.

Formation of the pair of low-resistance regions 106b can suppress degradation in on-state characteristics of a transistor that uses the oxide semiconductor film 106. The pair of low-resistance regions 106b has a sheet resistance of 30 kΩ/sq or less, preferably 10 kΩ/sq or less, further preferably 1 kΩ/sq or less, and still further preferably 0.7 kΩ/sq or less.

The high-resistance region 106a has a low concentration of components which are other than main components of the oxide semiconductor film, that is, impurities. For example, the concentrations of impurities in the high-resistance region 106a are $1\times10^{20}$ atoms/cm$^3$ or less, preferably $5\times10^{19}$ atoms/cm$^3$ or less, and further preferably $1\times10^{19}$ atoms/cm$^3$ or less. However, it is difficult to strictly classify components as main components or impurities; therefore, an element included at 1 at. % or more is regarded as a main component in this specification.

The high-resistance region 106a has a low concentration of impurities and a low density of defects. A channel region of the transistor illustrated in FIG. 1B is formed in the high-resistance region 106a, which results in excellent electrical characteristics and high reliability. Further, the off-state current of the transistor is small. For example, the transistor can have an off-state current of $1\times10^{-18}$ A or less, preferably $1\times10^{-21}$ A or less, and further preferably $1\times10^{-24}$ A or less per micrometer of a channel width.

A material used for the oxide semiconductor film 106 preferably contains at least indium (In) or zinc (Zn). In particular, In and Zn are preferably contained. As a stabilizer for reducing variation in electrical characteristics of a transistor that uses the oxide semiconductor film, gallium (Ga) is preferably additionally contained. Tin (Sn), hafnium (Hf), aluminum (Al), titanium (Ti), or zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide; an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electrical characteristics of the transistor due to irradiation with visible light or ultraviolet light is small. Thus, the transistor has high reliability.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of silicon germanium or the like; a silicon-on-insulator (SOI) substrate; or the like may be used as the substrate 100. Still alternatively, any of these substrates further provided with a semiconductor element is preferably used as the substrate 100.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 102 can be formed to have a single-layer structure or a layered structure using one or more of silicon oxide, silicon oxynitride, silicon nitride oxide, silicon nitride, aluminum oxide, aluminum nitride, hafnium oxide, zirconium oxide, yttrium oxide, gallium oxide, lanthanum oxide, cesium oxide, tantalum oxide, and magnesium oxide.

In addition, it is preferable that the base insulating film 102 be sufficiently flat. Specifically, the film serving as a base is provided so as to have an average surface roughness ($R_a$) of 1 nm or less, preferably 0.3 nm or less, further preferably 0.1 nm or less. When Ra is less than or equal to the above value, a crystal region is easily formed in the oxide semiconductor film 106. Note that $R_a$ is obtained by expanding, into three dimensions, arithmetic mean surface roughness that is defined by JIS B 0601: 2001 (ISO4287:1997) so as to be able to apply it to a curved surface. $R_a$ can be expressed as an "average value of the absolute values of deviations from a reference surface to a designated surface" and is defined by Formula 1.

$$Ra = \frac{1}{S_0} \int_{y1}^{y2} \int_{x1}^{x2} |f(x, y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the average height of the specific surface. Ra can be measured using an atomic force microscope (AFM).

Silicon oxynitride refers to a substance that contains a larger amount of oxygen than that of nitrogen. For example, silicon oxynitride contains oxygen, nitrogen, silicon, and hydrogen at concentrations ranging from 50 at. % to 70 at. % inclusive, from 0.5 at. % to 15 at. % inclusive, from 25 at. % to 35 at. % inclusive, and from 0 at. % to 10 at. % inclusive, respectively. In addition, silicon nitride oxide refers to a substance that contains a larger amount of nitrogen than that of oxygen. For example, silicon nitride oxide contains oxygen, nitrogen, silicon, and hydrogen at concentrations ranging from 5 at. % to 30 at. % inclusive, from 20 at. % to 55 at. % inclusive, from 25 at. % to 35 at. % inclusive, and from 10 at. % to 25 at. % inclusive, respectively. Note that the above ranges are ranges for cases where measurement is performed using Rutherford backscattering spectrometry (RBS) and hydrogen forward scattering spectrometry (HFS). Moreover, the total of the percentages of the constituent elements does not exceed 100 at. %.

It is preferable that an insulating film from which oxygen is released by heat treatment be used as the base insulating film 102.

Note that the expression "oxygen is released by heat treatment" means that the amount of released oxygen in the case of being converted into oxygen atoms in thermal desorption spectroscopy (TDS) analysis is $1.0\times10^{18}$ atoms/cm$^3$ or more, preferably $3.0\times10^{20}$ atoms/cm$^3$ or more.

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula 2 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \quad \text{[FORMULA 2]}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Formula 2. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

By supplying oxygen from the base insulating film 102 to the oxide semiconductor film 106, the density of interface states between the oxide semiconductor film 106 and the base insulating film 102 can be reduced. As a result, carrier trapping at the interface between the oxide semiconductor film 106 and the base insulating film 102 due to the operation of a transistor, or the like can be suppressed, and thus, a transistor with high reliability can be obtained.

Further, electric charge is generated owing to oxygen vacancy in the oxide semiconductor film 106 in some cases. In general, part of oxygen vacancies in the oxide semiconductor film 106 serves as a donor and causes release of an electron which is a carrier. As a result, the threshold voltage of a transistor shifts in the negative direction. When oxygen is sufficiently supplied from the base insulating film 102 to the oxide semiconductor film 106 and the oxide semiconductor film 106 preferably contains excessive oxygen, the density of oxygen vacancies in the oxide semiconductor film 106, which cause the negative shift of the threshold voltage, can be reduced.

The gate insulating film 108 may be formed using a method and a material similar to those of the base insulating film 102.

The gate electrode 110 may be formed using a method and a material similar to those of the pair of electrodes 104.

Further, in the transistor illustrated in FIG. 1B, the gate electrode 110 does not overlap with the pair of electrodes 104 and an offset region is formed in the oxide semiconductor film 106. One embodiment of the present invention is not limited to this structure. For example, a structure in which the gate electrode 110 overlaps with the pair of electrodes 104 may be employed.

The interlayer insulating film 112 is formed using a method and a material similar to those of the base insulating film 102.

It is preferable that the interlayer insulating film 112 have low relative permittivity and a sufficient thickness. For example, a silicon oxide film having a relative permittivity of approximately 3.8 and a thickness of greater than or equal to 300 nm and less than or equal to 1000 nm may be used. A surface of the interlayer insulating film 112 has a little fixed charge because of influence of atmospheric components and the like, which might cause the shift of the threshold voltage of the transistor. Therefore, it is preferable that the interlayer insulating film 112 have relative permittivity and a thickness such that the influence of the electric charge at the surface is sufficiently reduced. For the same reason, a resin film may be formed over the interlayer insulating film 112 to reduce the influence of the electric charge at the surface.

Figure 2:
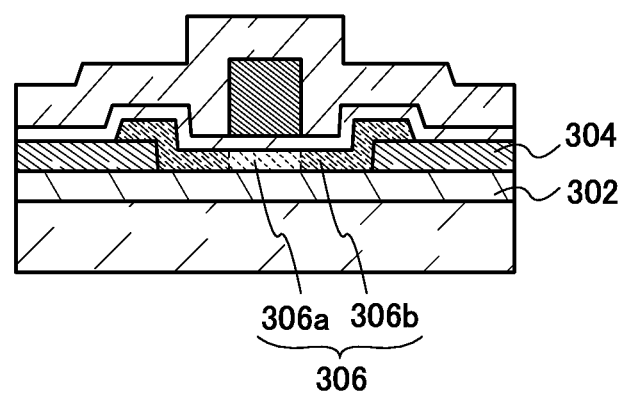
FIG. 2 is a cross-sectional view illustrating an example of a transistor in one embodiment of the present invention.

In the transistor structure illustrated in FIG. 1B, the surfaces of the pair of electrodes 104 and the base insulating film 102 are substantially aligned with each other and are flat. Thus, the transistor has a planar structure in which the oxide semiconductor film 106 is formed to be flat. However, the transistor is not limited to this structure. A structure illustrated in FIG. 2 may also be employed. In the transistor structure illustrated in FIG. 2, a pair of electrodes 304 is formed over a flat base insulating film 302 and an oxide semiconductor film 306 is formed thereover. Further, like the oxide semiconductor film 106 illustrated in FIG. 1B, FIG. 2 illustrates a structure in which the oxide semiconductor film 306 includes a pair of low-resistance regions 306b and a high-resistance region 306a. However, the transistor is not limited to this structure. The pair of low-resistance regions and the high-resistance region are not necessarily formed in the oxide semiconductor film. The structure illustrated in FIG. 1B requires planarization treatment such as chemical mechanical polishing (CMP). On the other hand, the structure illustrated in FIG. 2 does not require the planarization treatment, which simplifies the process.

Next, a method for manufacturing the transistor illustrated in FIG. 1B will be described with reference to FIGS. 3A to 3C and FIGS. 4A to 4C.

First, the base insulating film 102 is formed over the substrate 100. The base insulating film 102 can be formed by a chemical vapor deposition (CVD) method, a sputtering method, a molecular beam epitaxy (MBE) method, or a pulsed laser deposition (PLD) method and is preferably formed by a sputtering method. Note that depending on the material of the substrate 100, it is not necessary to provide the base insulating film 102.

Then, a conductive film is formed over the base insulating film 102. The conductive film is preferably formed by a sputtering method.

Figure 3A:
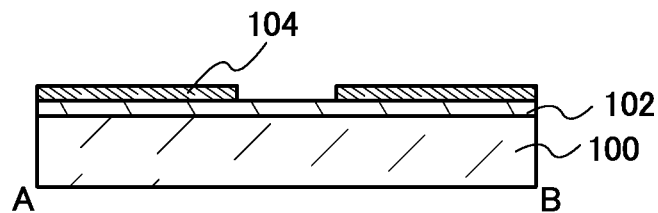
FIGS. 3A to 3C are cross-sectional views illustrating an example of a manufacturing process of a transistor in one embodiment of the present invention.

Next, the conductive film is processed to form the pair of electrodes 104 (see FIG. 3A). Note that "processing" means performing etching using a resist mask formed by a photolithography method to obtain a film having a desired shape, unless otherwise specified.

Next, an insulating film is formed to cover the pair of electrodes 104. The insulating film is formed using a material and a method similar to those of the base insulating film 102.

Figure 3B:
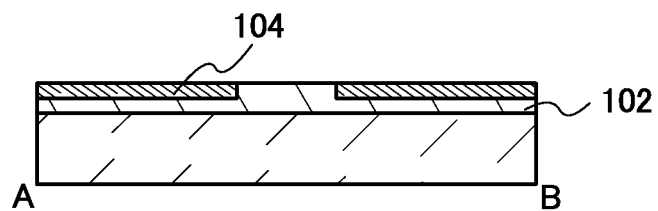

Then, the insulating film is polished through planarization treatment such as CMP treatment until the pair of electrodes 104 is exposed (see FIG. 3B).

Next, halogenation treatment is performed on the exposed pair of electrodes 104. As the halogenation treatment, plasma treatment in an atmosphere containing a halogen element can be performed. For example, the plasma treatment may be performed in an atmosphere containing a nitrogen trifluoride gas using a dry etching apparatus, a plasma CVD apparatus, or the like. The halogenation treatment is not limited to the plasma treatment. The halogenation treatment can also be performed by exposing an object to an atmosphere containing a halogen element. At this time, heating the object promotes the halogenation treatment, which is preferable. Alternatively, the treatment also may be performed by soaking the object in a liquid containing a halogen element.

After the halogenation treatment is performed on the pair of electrodes 104, an oxide semiconductor film is formed. The oxide semiconductor film may be formed by a CVD method, a sputtering method, an MBE method, or a PLD method and is preferably formed by a sputtering method.

After formation of the oxide semiconductor film, heat treatment may be performed. By the heat treatment, the degree of crystallinity of the oxide semiconductor film is increased. In addition, the concentration of impurities (such as hydrogen and moisture) in the oxide semiconductor film can be reduced, so that the density of defects can be reduced.

The heat treatment may be performed in an atmosphere selected from an oxidation atmosphere, an inert atmosphere, a reduced-pressure atmosphere, and a dry-air atmosphere or in a combined atmosphere of two or more of the aforementioned atmospheres. Preferably, heat treatment is performed in an inert atmosphere or a reduced-pressure atmosphere and then heat treatment is further performed in an oxidation atmosphere or a dry-air atmosphere. The heat treatment may be performed at a temperature higher than or equal to 150° C. and lower than or equal to 650° C., preferably higher than or equal to 250° C. and lower than or equal to 500° C., and further preferably higher than or equal to 300° C. and lower than or equal to 450° C. A resistance heating method, a method using a lamp heater, a method using a heated gas, or the like may be used in the heat treatment.

Note that the oxidation atmosphere refers to an atmosphere containing an oxidation gas. Oxidation gas is oxygen, ozone, nitrous oxide, or the like, and it is preferable that the oxidation gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). The oxidation atmosphere may contain a mixed gas of an oxidation gas and an inert gas. In that case, the atmosphere contains an oxidation gas at a concentration of at least higher than or equal to 10 ppm. By performing heat treatment in the oxidation atmosphere, the density of oxygen vacancies in the oxide semiconductor film can be reduced.

The inert atmosphere contains an inert gas such as nitrogen or a rare gas as its main component. Specifically, in an inert atmosphere, the concentration of a reactive gas such as an oxidation gas is lower than 10 ppm. By performing heat treatment in an inert atmosphere, the concentration of impurities included in the oxide semiconductor film can be reduced.

In the reduced-pressure atmosphere, a pressure of a treatment chamber is lower than or equal to 10 Pa. By performing heat treatment in a reduced-pressure atmosphere, the concentration of impurities included in the oxide semiconductor film can be reduced as compared to the case of employing the inert atmosphere.

The dry-air atmosphere refers to an atmosphere with a dew point of lower than or equal to −40° C., preferably lower than or equal to −50° C. and with an oxygen content of approximately 20% and a nitrogen content of approximately 80%. The dry-air atmosphere is a kind of the oxidation atmosphere. Since the dry-air atmosphere is relatively low in cost, it is suitable for mass production.

Figure 3C:
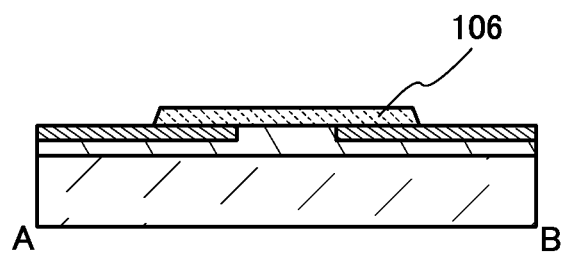

Next, the oxide semiconductor film is processed to form the oxide semiconductor film 106 (see FIG. 3C).

Next, the gate insulating film 108 is formed. The gate insulating film 108 may be formed by a CVD method, a sputtering method, an MBE method, or a PLD method and is preferably formed by a sputtering method in particular.

Next, a conductive film is formed. The conductive film may be formed by a CVD method, a sputtering method, an MBE method, or a PLD method and is preferably formed by a sputtering method in particular.

Figure 4A:
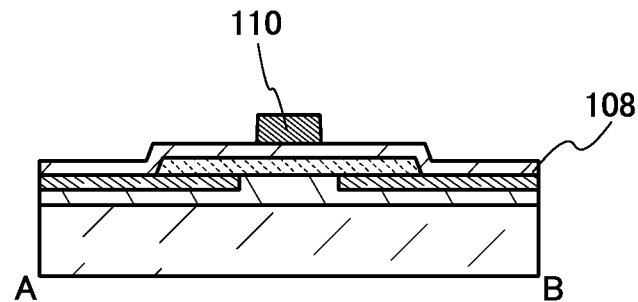
FIGS. 4A to 4C are cross-sectional views illustrating an example of a manufacturing process of a transistor in one embodiment of the present invention.

Next, the conductive film is processed to form the gate electrode 110 (see FIG. 4A).

Figure 4B:
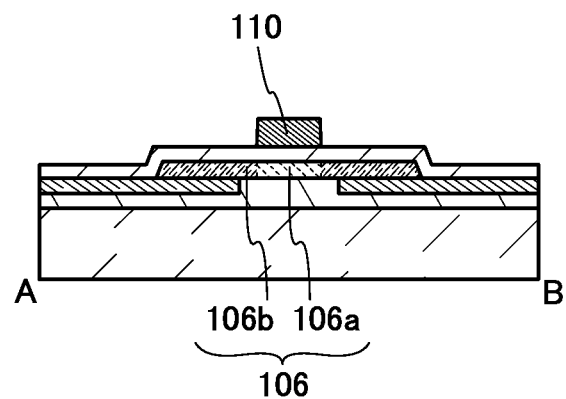

Next, using the gate electrode 110 as a mask, impurities that reduce the resistance of the oxide semiconductor film are added to the oxide semiconductor film 106, so that a pair of low-resistance regions 106b is formed (see FIG. 4B). Note that a region to which the impurities that reduce the resistance of the oxide semiconductor film are not added is a high-resistance region 106a.

As the added impurities that reduce the resistance of the oxide semiconductor film, one or more of hydrogen, helium, boron, nitrogen, fluorine, neon, aluminum, phosphorus, argon, arsenic, krypton, indium, tin, antimony, and xenon may be used. The method for adding the impurities may be an ion implantation method or an ion doping method. Alternatively, plasma treatment or heat treatment in an atmosphere containing the impurities that reduce the resistance of the oxide semiconductor film may be employed. Preferably, an ion implantation method is used. Further alternatively, after adding the impurities that reduce the resistance of the oxide semiconductor film by an ion implantation method, heat treatment may be performed in an inert atmosphere or a reduced-pressure atmosphere.

Figure 4C:
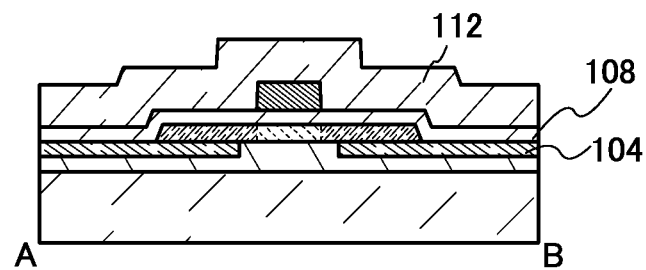

Next, the interlayer insulating film 112 is formed (see FIG. 4C). The interlayer insulating film 112 may be formed by a CVD method, a sputtering method, an MBE method, a PLD method, or a spin coating method and is preferably formed by a CVD method or a sputtering method.

Although not particularly illustrated, the pair of electrodes 104 may be exposed by processing the interlayer insulating film 112 and the gate insulating film 108, and wirings connected to the pair of electrodes 104 may be provided. In addition, a resin film may be provided over the interlayer insulating film 112.

The above-described steps can achieve a reduction in the contact resistance between the oxide semiconductor film and the pair of electrodes. Therefore, a transistor with excellent on-state characteristics can be provided.

(Embodiment 2)

In this embodiment, a transistor having a structure different from the structures of the transistors in Embodiment 1 and a method of manufacturing the transistor will be described with reference to FIGS. 5A and 5B and FIGS. 6A to 6C.

Figure 5A:
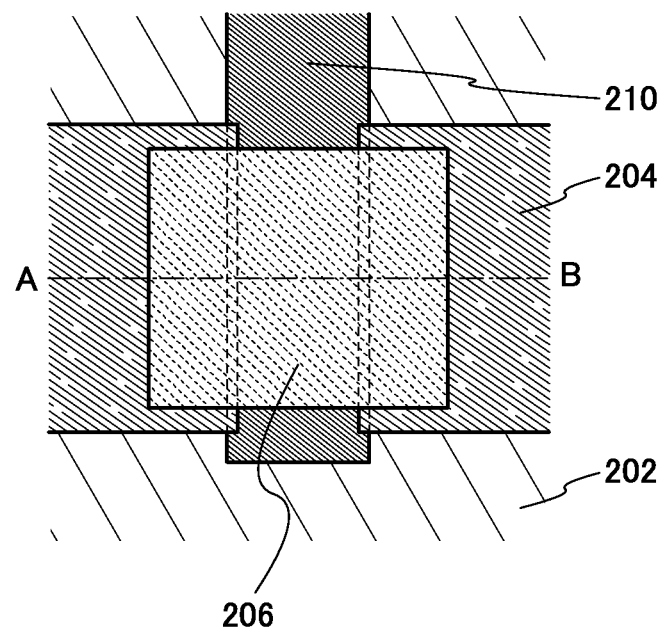
FIGS. 5A and 5B are a top view and a cross-sectional view illustrating an example of a transistor in one embodiment of the present invention.
Figure 5B:
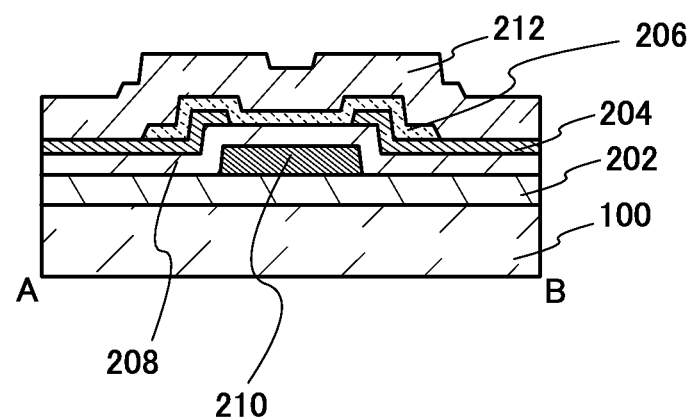

FIG. 5A is a top view and FIG. 5B is a cross-sectional view of a transistor which is a semiconductor device of one embodiment of the present invention. FIG. 5B illustrates a cross section A-B taken along a dashed-dotted line A-B in the top view of the transistor in FIG. 5A. Note that an interlayer insulating film 212, a gate insulating film 208, and the like are not illustrated in FIG. 5A for simplicity.

The transistor illustrated in FIG. 5B includes a base insulating film 202 over the substrate 100, a gate electrode 210 over the base insulating film 202, a gate insulating film 208 over the gate electrode 210, a pair of electrodes 204 over the gate insulating film 208, an oxide semiconductor film 206 overlapping with the gate electrode 210 with the gate insulating film 208 interposed therebetween, and an interlayer insulating film 212 over the oxide semiconductor film 206 and the pair of electrodes 204. Note that the base insulating film 202 may be omitted.

The pair of electrodes 204 contains a halogen element in the vicinity of the interface between the pair of electrodes 204 and the oxide semiconductor film 206. For example, fluorine or chlorine is contained. In this manner, the surface of the pair of electrodes 204 has a strong bond (such as a metal-fluorine bond), so that the reaction between the pair of electrodes 204 and the oxide semiconductor film 206 and the formation of another layer can be suppressed. Therefore, occurrence of a resistance component caused by the formation of another layer can be suppressed and the contact resistance between the pair of electrodes 204 and the oxide semiconductor film 206 can be reduced. At the same time, diffusion of oxygen from the oxide semiconductor film 206 into the pair of electrodes 204 can be prevented. Thus, formation of an oxygen vacancy in the oxide semiconductor film 206 can be suppressed.

Note that for layers of the transistor, materials and the like which are similar to those described in Embodiment 1 can be used.

Figure 6A:
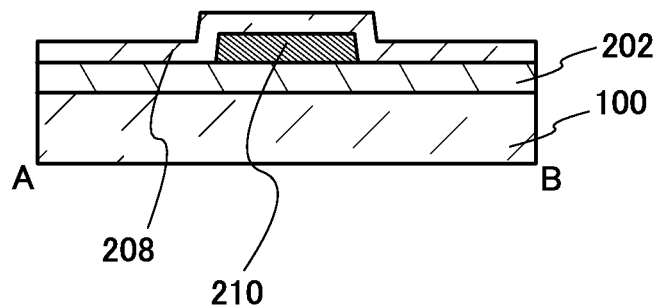
FIGS. 6A to 6C are cross-sectional views illustrating an example of a manufacturing process of a transistor in one embodiment of the present invention.

Next, a method for manufacturing the transistor illustrated in FIG. 5B will be described with reference to FIGS. 6A to 6C.

First, the base insulating film 202 is formed over the substrate 100. Note that depending on the material of the substrate 100, it is not necessary to provide the base insulating film 202.

Then, a conductive film is formed over the base insulating film 202. The conductive film is preferably formed by a sputtering method.

Next, the conductive film is processed to form the gate electrode 210. Note that "processing" means performing etching using a resist mask formed by a photolithography method to obtain a film having a desired shape.

Next, the gate insulating film 208 is formed. The gate insulating film 208 may be formed by a CVD method, a sputtering method, an MBE method, or a PLD method and is preferably formed by a sputtering method in particular (see FIG. 6A).

Next, a conductive film is formed over the gate insulating film 208. The conductive film may be formed by a CVD method, a sputtering method, an MBE method, or a PLD method and is preferably formed by a sputtering method in particular.

Figure 6B:
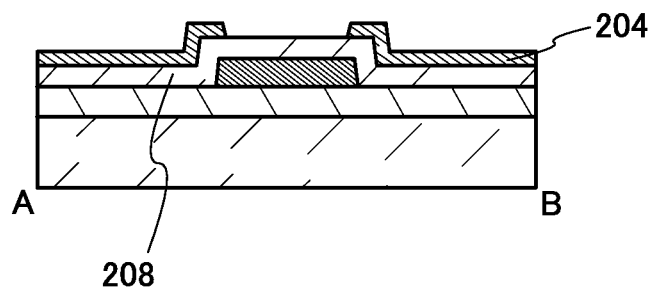

Next, the conductive film is processed to form the pair of electrodes 204 (see FIG. 6B).

Next, halogenation treatment is performed on the pair of electrodes 204. The halogenation treatment can be performed by plasma treatment in an atmosphere containing a halogen element. For example, the plasma treatment may be performed in an atmosphere containing a nitrogen trifluoride gas using a dry etching apparatus, a plasma CVD apparatus, or the like. The halogenation treatment is not limited to the plasma treatment. The halogenation treatment can also be performed by exposing an object to an atmosphere containing a halogen element. At this time, heating the object promotes the halogenation treatment, which is preferable.

After the halogenation treatment is performed on the pair of electrodes 204, an oxide semiconductor film is formed. The oxide semiconductor film may be formed by a CVD method, a sputtering method, an MBE method, or a PLD method and is preferably formed by a sputtering method.

After formation of the oxide semiconductor film, heat treatment may be performed. By the heat treatment, the degree of crystallinity of the oxide semiconductor film is increased. In addition, the concentration of impurities (such as hydrogen and moisture) in the oxide semiconductor film can be reduced so that the density of defects can be reduced. The heat treatment can be performed in a manner similar to that in Embodiment 1.

Next, the oxide semiconductor film is processed to form the oxide semiconductor film 206.

Figure 6C:
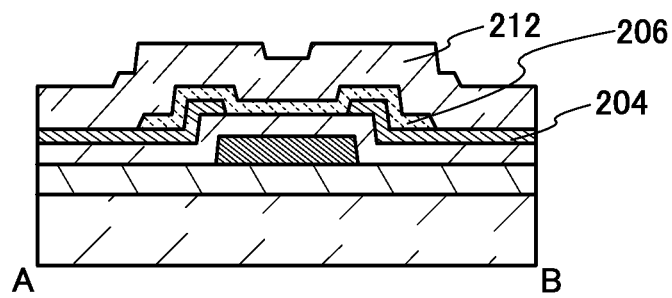

Next, the interlayer insulating film 212 is formed (see FIG. 6C). The interlayer insulating film 212 may be formed by a CVD method, a sputtering method, an MBE method, a PLD method, or a spin coating method and is preferably formed by a CVD method or a sputtering method.

Although not particularly illustrated, the pair of electrodes 204 may be exposed by processing the interlayer insulating film 212, and wirings connected to the pair of electrodes 204 may be provided. In addition, a resin film may be provided over the interlayer insulating film 212.

The above-described steps can achieve a reduction in the contact resistance between the oxide semiconductor film and the pair of electrodes. Therefore, a transistor with excellent on-state characteristics can be provided.

(Embodiment 3)

In this embodiment, an example of manufacturing a semiconductor memory device using any of the transistors described in Embodiments 1 and 2 will be described.

Typical examples of a volatile semiconductor memory device include a dynamic random access memory (DRAM) which stores data in such a manner that a transistor included in a memory element is selected and electric charge is accumulated in a capacitor, and a static random access memory (SRAM) which holds stored data using a circuit such as a flip-flop.

Typical examples of a nonvolatile semiconductor memory device include a flash memory which has a node between a gate and a channel region of a transistor and stores data by holding electric charge in the node.

Any of the transistors described in Embodiments 1 and 2 can be applied to part of transistors included in the above-described semiconductor memory device.

First, a semiconductor memory device to which any of the transistors described in Embodiments 1 and 2 is applied will be described with reference to FIGS. 7A and 7B.

Figure 7A:
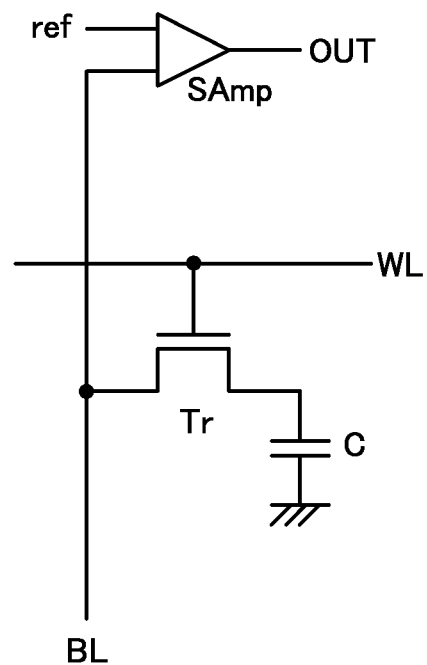
FIG. 7A is a circuit diagram illustrating an example of a semiconductor memory device including a transistor in one embodiment of the present invention and FIG. 7B is a graph showing electrical characteristics thereof.

A memory cell includes a bit line BL, a word line WL, a sense amplifier SAmp, a transistor Tr, and a capacitor C (see FIG. 7A).

Figure 7B:
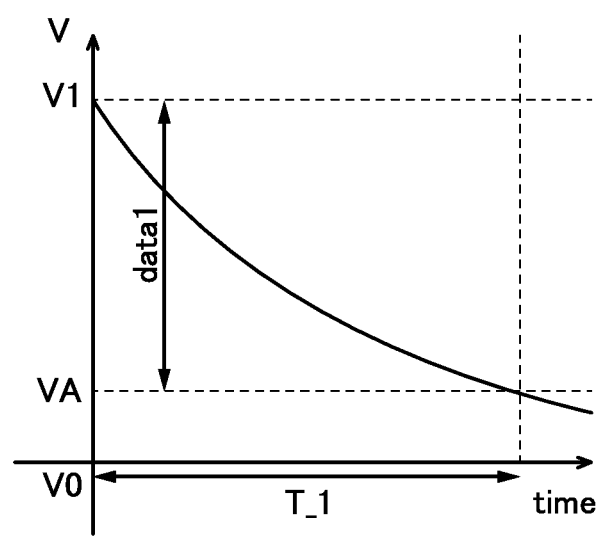

It is known that voltage held in the capacitor C is gradually decreased with time as shown in FIG. 7B owing to the off-state current of the transistor Tr. After a certain period of time, the voltage originally charged from V0 to V1 is decreased to VA which is a limit for reading out data 1. This period is called a holding period T_1. In the case of a two-level memory cell, refresh operation needs to be performed within the holding period T_1.

Here, when any of the transistors described in Embodiments 1 and 2 is used as the transistor Tr, the holding period T_1 can be increased because the off-state current of the transistor is small. That is, the intervals between refresh operations can be extended; thus, power consumption can be reduced. For example, in a DRAM including a transistor in which an oxide semiconductor film is used and whose off-state current is less than or equal to $1\times10^{-21}$ A, preferably less than or equal to $1\times10^{-24}$ A, data can be held for several days to several decades without supply of electric power.

As described above, according to one embodiment of the present invention, a semiconductor memory device with high reliability and low power consumption can be obtained.

By applying any of the transistors having excellent on-state characteristics described in Embodiments 1 and 2, it is possible to provide a semiconductor memory device capable of high-speed operation, in which electric charge can be quickly accumulated in the capacitor C.

Next, a semiconductor memory device to which any of the transistors described in Embodiments 1 and 2 is applied will be described with reference to FIGS. 8A and 8B.

Figure 8A:
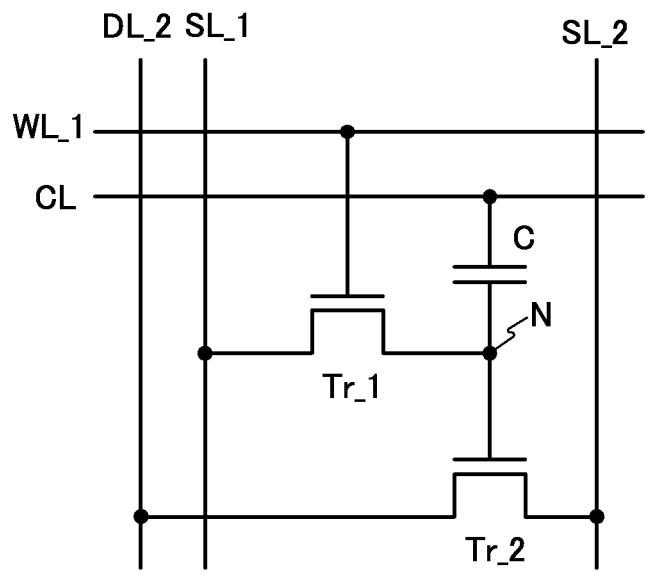
FIG. 8A is a circuit diagram illustrating an example of a semiconductor memory device including a transistor in one embodiment of the present invention and FIG. 8B is a graph showing electrical characteristics thereof.
Figure 8B:
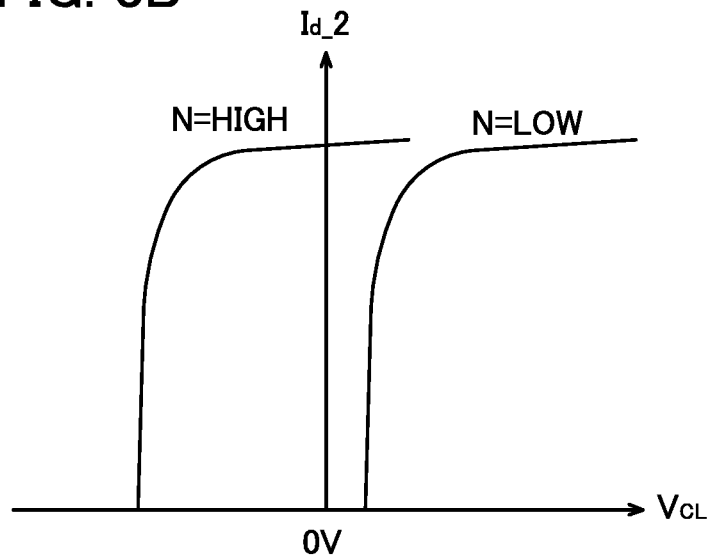

FIG. 8A is a circuit diagram of a semiconductor memory device. The semiconductor memory device includes a transistor Tr_1, a word line WL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

Note that the semiconductor memory device described in this embodiment utilizes variation in the threshold voltage of the transistor Tr_2, which depends on the potential of the node N. For example, FIG. 8B is a graph showing a relation between the drain current $I_d\_2$ flowing through the transistor Tr_2 and the voltage $V_{CL}$ of the capacitor line CL.

Here, the voltage of the node N can be adjusted through the transistor Tr_1. For example, the potential of the source line SL_1 is set to a power supply potential VDD. In this case, when the potential of the word line WL_1 is set to higher than or equal to a potential obtained by adding the power supply potential VDD to the threshold voltage Vth of the transistor Tr_1, the voltage of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_{d\_2}$ curve (N=LOW) or a $V_{CL}$-$I_{d\_2}$ curve (N=HIGH) can be obtained. That is, when N=LOW, $I_{d\_2}$ is small at a $V_{CL}$ of 0 V; accordingly, data 0 is stored. Further, when N=HIGH, $I_{d\_2}$ is large at a $V_{CL}$ of 0 V; accordingly, data 1 is stored. In this manner, data can be stored.

Here, when any of the transistors described in Embodiments 1 and 2 is used as the transistor Tr_1, the off-state current of the transistor can be significantly reduced; therefore, unintentional leakage of an electric charge accumulated in the node N by flowing between the source and the drain of the transistor Tr_1 can be suppressed. Therefore, data can be held for a long period. By using one embodiment of the present invention, the threshold voltage of the transistor Tr_1 is controlled, which enables reduction in the voltage necessary for writing. Thus, power consumption can be made small as compared with that of a flash memory or the like.

Note that any of the transistors described in Embodiments 1 and 2 may be applied to the transistor Tr_2. The transistor has excellent on-state characteristics. Accordingly, a semiconductor memory device including the transistor can operate at high speed.

As described above, according to one embodiment of the present invention, a semiconductor memory device having high reliability for a long period and low power consumption and being capable of high-speed operation can be obtained.

This embodiment can be implemented in appropriate combination with the other embodiments.

(Embodiment 4)

A central processing unit (CPU) can be formed using any of the transistors described in Embodiments 1 and 2 or the semiconductor memory device described in Embodiment 3 for at least part of the CPU.

Figure 9A:
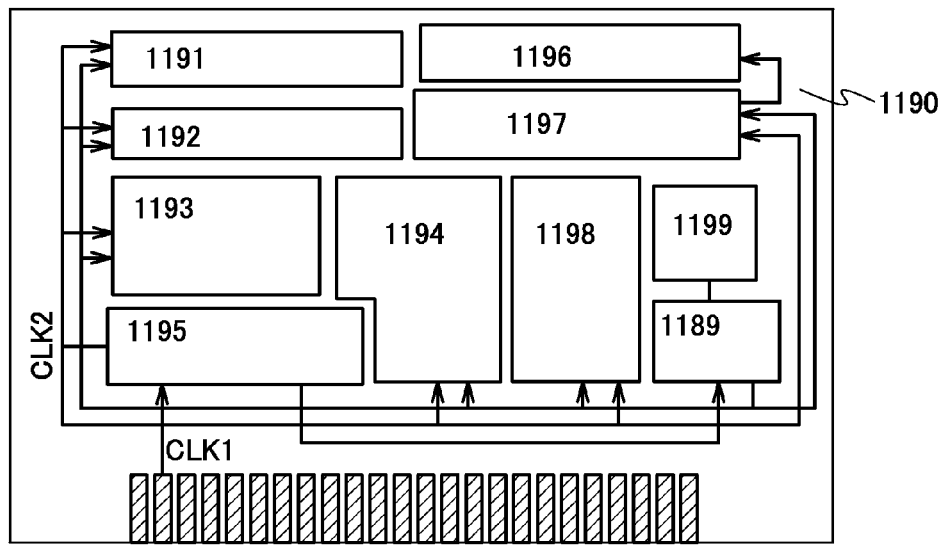
FIG. 9A is a block diagram illustrating a specific example of a CPU including a transistor in one embodiment of the present invention.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 9A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 9A, a memory element is provided in the register 1196. As the memory element in the register 1196, the semiconductor memory device described in Embodiment 3 can be used.

In the CPU illustrated in FIG. 9A, the register controller 1197 selects operation of retaining data in the register 1196 in accordance with an instruction from the ALU 1191. That is, the register controller 1197 selects whether data is retained by a logic element which inverts a logic (logic level) or a capacitor in the memory element included in the register 1196. When data is retained by the logic element which inverts a logic (logic level), a power supply voltage is supplied to the memory element in the register 1196. When data is retained by the capacitor, the data in the capacitor is rewritten, and supply of the power supply voltage to the memory element in the register 1196 can be stopped.

Figure 9B:
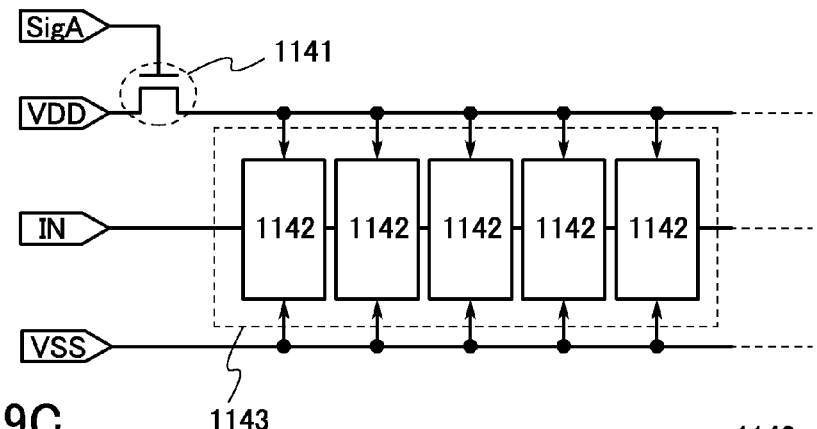
FIGS. 9B and 9C are circuit diagrams each illustrating a part of the CPU.
Figure 9C:
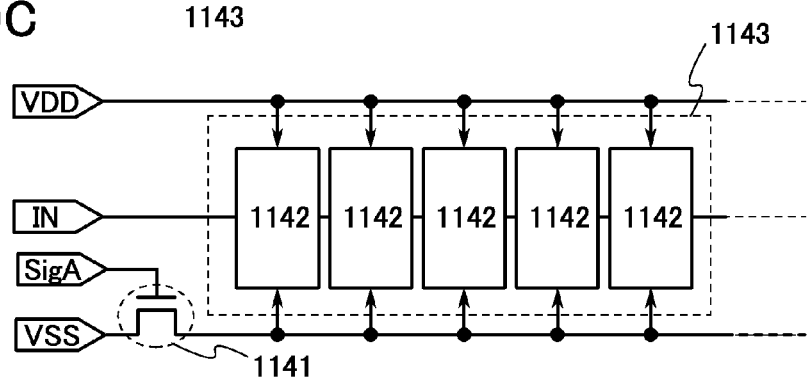

The power supply can be stopped by providing a switching element between a memory element group and a node to which a power supply potential VDD or a power supply potential VSS is supplied, as illustrated in FIG. 9B or FIG. 9C. Circuits illustrated in FIGS. 9B and 9C will be described below.

FIGS. 9B and 9C each illustrate an example of a structure including any of the transistors described in Embodiments 1 and 2 as a switching element for controlling supply of a power supply potential to a memory element.

The memory device illustrated in FIG. 9B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 9B, a transistor whose active layer includes a semiconductor with a wide bandgap, such as an oxide semiconductor, is used as the switching element 1141, and the switching of the transistor is controlled by a signal SigA supplied to a gate thereof.

Note that FIG. 9B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 9C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented by being combined as appropriate with any of the above-described embodiments.

(Embodiment 5)

In this embodiment, examples of an electronic device including at least one of the transistors, the semiconductor memory device, and the CPU described in Embodiments 1 to 4 will be described.

Figure 10A:
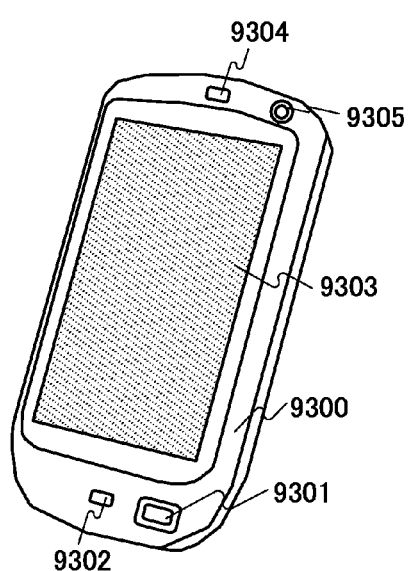
FIGS. 10A to 10D are perspective views illustrating examples of electronic devices each including a transistor in one embodiment of the present invention.

FIG. 10A illustrates a portable information terminal. The portable information terminal illustrated in FIG. 10A includes a housing 9300, a button 9301, a microphone 9302, a display portion 9303, a speaker 9304, and a camera 9305, and has a function as a mobile phone.

Figure 10B:
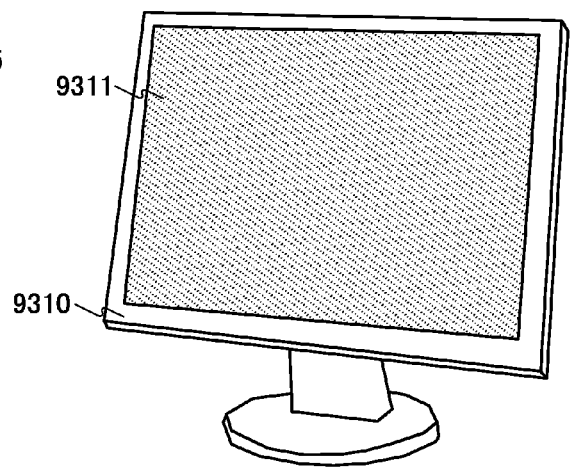

FIG. 10B illustrates a display. The display illustrated in FIG. 10B includes a housing 9310 and a display portion 9311.

Figure 10C:
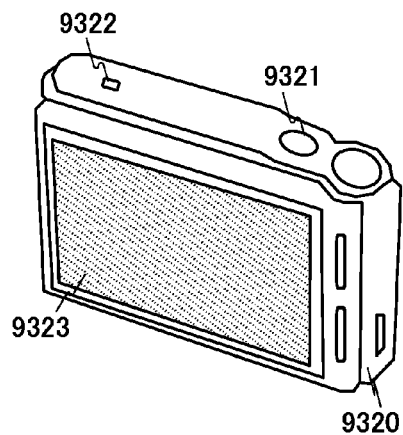

FIG. 10C illustrates a digital still camera. The digital still camera illustrated in FIG. 10C includes a housing 9320, a button 9321, a microphone 9322, and a display portion 9323.

Figure 10D:
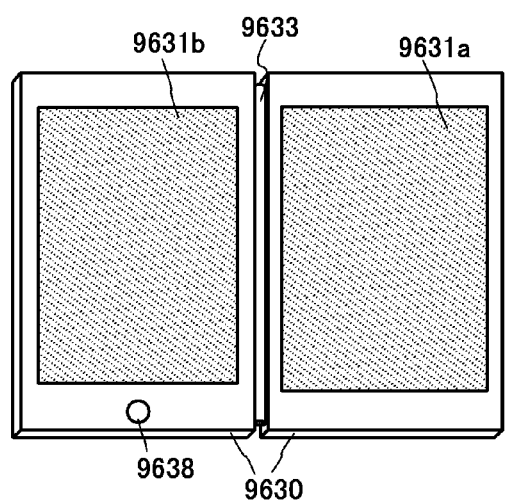

FIG. 10D illustrates a double-foldable portable information terminal. The double-foldable portable information terminal illustrated in FIG. 10D includes a housing 9630, a display portion 9631a, a display portion 9631b, a hinge 9633, and an operation switch 9638.

Part or whole of the display portion 9631a and/or the display portion 9631b can function as a touch panel. By touching an operation key displayed on the touch panel, a user can input data, for example.

By applying one embodiment of the present invention, the performance of an electronic device can be improved.

This embodiment can be implemented in appropriate combination with the other embodiments.

This application is based on Japanese Patent Application serial no. 2011-246328 filed with Japan Patent Office on Nov. 10, 2011, the entire contents of which are hereby incorporated by reference.

What is claimed is:

1. A semiconductor device comprising:
a base insulating film over a substrate;
a pair of electrodes over the base insulating film;
an oxide semiconductor film over and in contact with the pair of electrodes;
a gate electrode over the base insulating film; and
a gate insulating film adjacent to the gate electrode and the oxide semiconductor film,
wherein the pair of electrodes comprises a region in contact with the oxide semiconductor film,
wherein halogen is included at least in the region, and
wherein a top surface of the pair of electrodes is aligned with a portion of a top surface of the base insulating film.

2. The semiconductor device according to claim 1, wherein the gate insulating film is over the oxide semiconductor film, and wherein the gate electrode is overlapping with the oxide semiconductor film.

3. The semiconductor device according to claim 1, wherein the gate insulating film is over the gate electrode, and wherein the pair of electrodes is over the gate insulating film.

4. The semiconductor device according to claim 1, wherein the region is in contact with upper surfaces of the pair of electrodes.

5. The semiconductor device according to claim 1, wherein the halogen is fluorine.

6. The semiconductor device according to claim 1,
wherein the region comprises a bond between the halogen and metal included in the pair of electrodes.

7. The semiconductor device according to claim 1,
wherein the oxide semiconductor film comprises a pair of low-resistance regions partly overlapping with the pair of electrodes and a high-resistance region overlapping with the gate electrode,
wherein the pair of low-resistance regions has a lower resistance than the high-resistance region, and
wherein the pair of low-resistance regions have a sheet resistance of 30 kΩ/sq or less.

8. The semiconductor device according to claim 7,
wherein the pair of low-resistance regions comprises at least any one of elements selected from hydrogen, helium, boron, nitrogen, fluorine, neon, aluminum, phosphorus, argon, arsenic, krypton, indium, tin, antimony, and xenon.

9. The semiconductor device according to claim 1,
wherein the oxide semiconductor film is a c-axis aligned crystalline oxide semiconductor film.

10. The semiconductor device according to claim 1,
wherein the oxide semiconductor film comprises at least any one of materials selected from In, Ga, Zn, and O.

11. A semiconductor device comprising:
a base insulating film over a substrate;
a pair of electrodes over the base insulating film;
an oxide semiconductor film over and in contact with the pair of electrodes;
a gate electrode over the base insulating film;
a gate insulating film adjacent to the gate electrode and the oxide semiconductor film; and
an interlayer insulating film over the gate electrode,
wherein the pair of electrodes comprises a region in contact with the oxide semiconductor film,
wherein halogen is included at least in the region, and
wherein a top surface of the pair of electrodes is aligned with a portion of a top surface of the base insulating film.

12. The semiconductor device according to claim 11,
wherein the gate insulating film is over the oxide semiconductor film, and
wherein the gate electrode is overlapping with the oxide semiconductor film.

13. The semiconductor device according to claim 11, wherein the gate insulating film is over the gate electrode, and wherein the pair of electrodes is over the gate insulating film.

14. The semiconductor device according to claim 11, wherein the region is in contact with upper surfaces of the pair of electrodes.

15. The semiconductor device according to claim 11, wherein the halogen is fluorine.

16. The semiconductor device according to claim 11,
wherein the region comprises a bond between the halogen and metal included in the pair of electrodes.

17. The semiconductor device according to claim 11,
wherein the oxide semiconductor film comprises a pair of low-resistance regions partly overlapping with the pair of electrodes and a high-resistance region overlapping with the gate electrode,
wherein the pair of low-resistance regions has a lower resistance than the high-resistance region, and wherein the pair of low-resistance regions have a sheet resistance of 30 kΩ/sq or less.

18. The semiconductor device according to claim 17, wherein the pair of low-resistance regions comprises at least any one of elements selected from hydrogen, helium, boron, nitrogen, fluorine, neon, aluminum, phosphorus, argon, arsenic, krypton, indium, tin, antimony, and xenon.

19. The semiconductor device according to claim 11, wherein the oxide semiconductor film is a c-axis aligned crystalline oxide semiconductor film.

20. The semiconductor device according to claim 11, wherein the oxide semiconductor film comprises at least any one of materials selected from In, Ga, Zn, and O.

* * * * *